(12) United States Patent
Yamamichi et al.

(10) Patent No.: US 8,872,334 B2
(45) Date of Patent: Oct. 28, 2014

(54) METHOD FOR MANUFACTURING SEMICONDUCTOR DEVICE

(75) Inventors: Shintaro Yamamichi, Tokyo (JP);
Katsumi Kikuchi, Tokyo (JP); Yoshiki Nakashima, Tokyo (JP); Kentaro Mori, Tokyo (JP)

(73) Assignee: NEC Corporation, Tokyo (JP)

( * ) Notice: Subject to any disclaimer, the term of this patent is extended or adjusted under 35 U.S.C. 154(b) by 6 days.

(21) Appl. No.: 13/636,324

(22) PCT Filed: Mar. 22, 2011

(86) PCT No.: PCT/JP2011/056817
§ 371 (c)(1),
(2), (4) Date: Oct. 16, 2012

(87) PCT Pub. No.: WO2011/118572
PCT Pub. Date: Sep. 29, 2011

(65) Prior Publication Data
US 2013/0026653 A1    Jan. 31, 2013

(30) Foreign Application Priority Data
Mar. 23, 2010  (JP) ............................. P2010-066631

(51) Int. Cl.
*H01L 23/48*  (2006.01)
*H01L 23/538*  (2006.01)
(Continued)

(52) U.S. Cl.
CPC ........ *H05K 1/185* (2013.01); *H01L 2924/0103* (2013.01); *H01L 23/5389* (2013.01); *H05K*
(Continued)

(58) Field of Classification Search
USPC .......... 257/734, 499, E23.021, 750, 758, 774, 257/686, 777; 438/127, 107, 109, 110, 622, 438/623, 629, 637, 638, 639, 640, 675
See application file for complete search history.

(56) References Cited

U.S. PATENT DOCUMENTS

2002/0190375 A1*  12/2002  Mashino et al. .............. 257/734
2004/0033654 A1    2/2004   Yamagata
(Continued)

FOREIGN PATENT DOCUMENTS

JP    2001332654 A    11/2001
JP    2004079701 A     3/2004
(Continued)

OTHER PUBLICATIONS
The international search report for PCT/JP2011/056817 mailed on Jun. 28, 2011.

*Primary Examiner* — S. V. Clark
*Assistant Examiner* — Krista Soderholm
(74) *Attorney, Agent, or Firm* — Sughrue Mion, PLLC

(57) ABSTRACT

In a manufacturing method of a semiconductor device incorporating a semiconductor element in a multilayered wiring structure including a plurality of wiring layers and insulating layers, a semiconductor element is mounted on a silicon support body whose thickness is reduced to a desired thickness and which are equipped with a plurality of through-vias running through in the thickness direction; an insulating layer is formed to embed the semiconductor element; then, a plurality of wiring layers is formed on the opposite surfaces of the silicon support body in connection with the semiconductor element. Thus, it is possible to reduce warping which occurs in proximity to the semiconductor element in manufacturing, thus improving a warping profile in the entirety of a semiconductor device. Additionally, it is possible to prevent semiconductor elements from becoming useless, improve a yield rate, and produce a thin-type semiconductor device with high-density packaging property.

8 Claims, 15 Drawing Sheets

(51) Int. Cl.
*H05K 3/46* (2006.01)
*H05K 1/18* (2006.01)
*H01L 23/00* (2006.01)
*H01L 23/66* (2006.01)
*H01L 23/498* (2006.01)

(52) U.S. Cl.
CPC ....... 2201/10674 (2013.01); *H01L 2924/10329* (2013.01); *H01L 2924/01013* (2013.01); *H01L 2924/01073* (2013.01); *H05K 2201/09581* (2013.01); *H01L 2924/01029* (2013.01); *H01L 2924/01042* (2013.01); *H01L 2224/18* (2013.01); *H01L 2224/32225* (2013.01); H05K 3/4605 (2013.01); *H01L 2924/01004* (2013.01); *H01L 2924/15311* (2013.01); *H01L 23/66* (2013.01); *H01L 2224/73267* (2013.01); *H01L 2224/73204* (2013.01); *H01L 2924/01023* (2013.01); *H05K 2203/1469* (2013.01); *H01L 2924/01019* (2013.01); *H01L 2224/92244* (2013.01); *H01L 2924/014* (2013.01); *H01L 2224/16225* (2013.01); *H01L 2924/01047* (2013.01); H01L 23/5384 (2013.01); *H01L 2924/01079* (2013.01); *H01L 2924/01082* (2013.01); *H01L 2924/01033* (2013.01); *H01L 2924/01074* (2013.01); *H01L 2924/01032* (2013.01); H01L 24/18 (2013.01); *H01L 23/49816* (2013.01)
USPC .................. 257/734; 257/499; 257/E23.021; 257/750; 257/758; 257/774; 257/686; 257/777; 438/127; 438/107; 438/109; 438/110; 438/622; 438/623; 438/629; 438/637; 438/638; 438/675

(56) References Cited

U.S. PATENT DOCUMENTS

| | | |
|---|---|---|
| 2006/0163740 A1 | 7/2006 | Ohno et al. |
| 2006/0208356 A1 | 9/2006 | Yamano et al. |
| 2007/0145518 A1* | 6/2007 | Mihara ......................... 257/499 |

FOREIGN PATENT DOCUMENTS

| | | |
|---|---|---|
| JP | 2006261246 A | 9/2006 |
| JP | 2007134569 A | 5/2007 |
| JP | 2007324429 A | 12/2007 |
| JP | 2008042063 A | 2/2008 |
| WO | 2005081312 A1 | 9/2005 |

* cited by examiner

US 8,872,334 B2

METHOD FOR MANUFACTURING SEMICONDUCTOR DEVICE

TECHNICAL FIELD

The present invention relates to a method for manufacturing a semiconductor device with a wiring substrate incorporating a semiconductor element.

The present application claims priority on Japanese Patent Application No. 2010-66631 filed Mar. 23, 2010, the entire content of which is incorporated herein by reference.

BACKGROUND ART

Due to a recent tendency of continuously reducing size and thickness of electronic devices, a high-density packaging technology has been increasingly advanced along with fine processing and integration of semiconductor elements.

Generally, a wire bonding method using metal wires and a flip chip bonding method using solder balls have been adopted as a method for bonding a wiring substrate and a semiconductor element in a semiconductor element package.

The wire bonding method is advantageous in that it may achieve low-cost packaging with respect to semiconductor elements having a small number of pads, whereas it is necessary to reduce the diameter of each wire due to increasingly reduced pitches between pads of semiconductor elements; hence, wire breaks may cause a problem of a low yield rate in an assembling process.

Compared to the wire bonding method, the flip chip bonding method achieves high-speed signal transmission between semiconductor elements and wiring substrates, whereas due to an increasing number of pads of semiconductor elements and due to increasingly reduced pitches between pads of semiconductor elements, solder bumps undergo weak bonding strengths, which may lead to the formation of cracks at bonded points and the frequent occurrence of bonding defects.

Recently, a semiconductor element incorporating technology using packages with wiring substrates, including supporting substrates, incorporating semiconductor elements has been developed as a high-density packaging technology which realizes further integration and highly-advanced functionality in semiconductor devices and which results in many advantages such as thin packages, low cost, adaptability to high frequencies, low stress bonding, and improvement of electromigration property.

FIG. 37 shows the structure of a semiconductor element incorporated substrate disclosed in Patent Literature 1. The semiconductor element incorporated substrate includes an insulating resin substrate 1, a wire 2 formed on one surface thereof, and an electronic circuit. Herein, bumps 3 are formed for the purpose of bonding the electronic circuit, wherein a semiconductor element 4 is embedded inside the insulating resin substrate 1 such that the bump 3 will be connected to the wire 2.

FIG. 38 shows the structure of a semiconductor element incorporated substrate disclosed in Patent Literature 2. The semiconductor element incorporated substrate includes an insulating layer 6 incorporating a semiconductor element 5, and a wiring structure 7 connected to the semiconductor element 5, wherein a reinforcing structure 8 is embedded in the insulating layer 6.

CITATION LIST

Patent Literature

Patent Literature 1: Japanese Patent Application Publication No. 2007-134569
Patent Literature 2: Japanese Patent Application Publication No. 2006-261246
Patent Literature 3: Japanese Patent Application Publication No. 2004-79701

SUMMARY OF INVENTION

Technical Problem

The foregoing semiconductor element incorporating technology suffers from the following problems.

In Patent Literature 1, a semiconductor element incorporated substrate is produced via flip chip bonding for attaching the semiconductor element 4 to a wiring layer 9 of a thin rolled copper, wherein the entirety of the insulating resin substrate 1 may be greatly bent or warped during the flip chip bonding or the incorporating process using an insulating resin. This is because a support body securing entire rigidity of a semiconductor device does not remain in the structure shown in FIG. 37 in which the semiconductor element 4 is incorporated into the insulating resin substrate 1.

In contrast, Patent Literature 2 suppresses warpage of a semiconductor element incorporated substrate in which the reinforcing structure 8 is embedded in the insulating layer 6 surrounding the semiconductor element 5. However, the reinforcing structure 8 may exist solely in the periphery of the semiconductor element 5, leaving no support body securing the entire rigidity of a semiconductor device.

The inventors have studied the structures of semiconductor element incorporated substrates, thus revealing the fact that the entirety of a semiconductor device is formed in a downwardly-convex warping shape when the semiconductor element 4 is solely incorporated into the insulating resin substrate 1 having no support body, but an upwardly-convex warpage occurs solely in the periphery of the semiconductor element 4. FIG. 36 shows positional dependency of a warping rate of a semiconductor element incorporated substrate. In FIG. 36, a dashed line indicates a warping profile of a semiconductor element incorporated substrate of Patent Literature 1. Herein, internal stress is accumulated due to differences of thermal expansion coefficients between a support body, bonds, the semiconductor element 4, and the insulating resin substrate 1; thereafter, due to removal of a support body, a large downwardly-convex warpage occurs in the entirety of a semiconductor element incorporated substrate whilst an upwardly-convex warpage occurs locally in the embedded area of the semiconductor element 4. In particular, this warping profile occurs significantly when a support body is a metal such as copper. The hardening and contraction of the insulating resin substrate 1 causes a downwardly-convex warpage in the periphery of the semiconductor element 4 due to a high thermal expansion coefficient of the insulating resin substrate 1, whilst an upwardly-convex warpage occurs in the embedded area of the semiconductor element 4 due to a small thermal expansion coefficient of the semiconductor element 4.

For example, the semiconductor element 4 made of silicon has a thermal expansion coefficient of about 3.5 ppm/K; the insulating resin substrate 1 made of an epoxy resin has a thermal expansion coefficient of about 60 ppm/K; and the support body made of copper has a thermal expansion coefficient of about 17 ppm/K. Among these constituent elements of a semiconductor device, the semiconductor element 4 has the lowest thermal expansion coefficient. Internal stress is concentrated at the periphery of the semiconductor element 4 since the entire warpage of a semiconductor element incorporated substrate is directed inversely to the local warpage of the periphery of the semiconductor element 4. The semiconductor element 4 is incorporated into a substrate via solder; therefore, in a reliability assessment test such as a temperature cycling test, the predetermined number of cycles or less may cause cracks in an insulating resin in the periphery of the semiconductor element 4, thus causing open defects of wiring.

To suppress this characteristic warping profile, it is necessary to reduce the volume of the semiconductor element 4 having the smallest thermal expansion coefficient among the constituent elements of a semiconductor device; that is, it is necessary to reduce the thickness of the semiconductor element 4. This may slightly reduce an upwardly-convex warpage in the embedded area of the semiconductor element 4, whereas a handling ability of a manufacturing process is degraded due to the entirely reduced thinness of the semiconductor element 4; this may cause the frequent occurrence of chipping defects and cracking defects in the periphery of the semiconductor element 4.

To solve the above problem, Patent Literature 3 discloses a semiconductor device which is manufactured such as to form a wiring layer is formed or reduce the thickness of a silicon support body forming a through-via after an interposer is equipped with a semiconductor element. However, when through-vias are defectively connected to wiring layers, the already incorporated semiconductor elements become useless; this may cause a negative influence on a yield rate of semiconductor devices.

It is an object of the present invention to provide a method for manufacturing a semiconductor device, which is able to prevent a semiconductor element from becoming useless in a manufacturing process of a semiconductor device, thus improving a yield rate of semiconductor devices.

It is another object of the present invention to provide a manufacturing method, which is able to prevent a warpage occurring proximate to a semiconductor element, improve a reliability of a semiconductor device, and produce a high-density semiconductor device with a further reduced thickness.

Solution to Problem

The present invention provides a manufacturing method of a semiconductor device incorporating a semiconductor element in a multilayered wiring structure configured of a plurality of wiring layers and insulating layers. According to the manufacturing method of a semiconductor device, a plurality of through-vias running through a silicon support body in its thickness direction is formed after the thickness of the silicon support body is reduced to a desired thickness; the semiconductor element is mounted on the silicon support body; an insulating layer embedding the semiconductor element is formed on the silicon support body; then, a plurality of wiring layers is formed on the opposite surfaces of the silicon support body in connection with the semiconductor element.

In the manufacturing method of a semiconductor device, when a plurality of through-vias is formed after the thickness of the silicon support body is reduced to the desired thickness, each of the through-vias is formed with a half-filled via structure in which one side thereof in the thickness direction of the silicon support body is filled with a conductor while the other side thereof is filled with the insulating layer.

In this case, the insulating layer filled portions of the through-vias, formed in the silicon support body, may be alternately aligned in different sides.

Advantageous Effects of Invention

The present invention is able to reduce warping of a semiconductor device, which occurs in manufacturing, by use of a silicon support body whose thickness is reduced in advance, thus improving a warping profile. Thus, it is possible to improve a yield rate in wiring semiconductor element incorporated substrates, reduce a loss of discarding good semiconductor elements due to bad wiring, and reduce the manufacturing cost. Additionally, it is possible to suppress warping of semiconductor element incorporated substrates and therefore improve reliability of semiconductor devices by use of silicon support bodies forming through-vias. In particular, it is possible to prevent semiconductor devices from being degraded due to a temperature cycling test. Owing to a small warping rate of a semiconductor device, it is possible to finely structure wiring layers of a semiconductor element incorporated substrate; hence, it is possible to reduce the manufacturing cost due to the reduced number of wiring layers. Moreover, it is possible to reduce the entire thickness of a semiconductor element incorporated substrate because the semiconductor element will not be degraded in its strength irrespective of a reduction of its thickness.

DESCRIPTION OF EMBODIMENTS

A manufacturing method of a semiconductor device according to the present invention will be described with reference to the accompanying drawings. Various semiconductor devices, which can be manufactured according to the manufacturing method of the present invention, will be described at first; thereafter, the manufacturing method of a semiconductor device will be described in conjunction with a first embodiment and a second embodiment.

(First Semiconductor Device)

Figure 1:
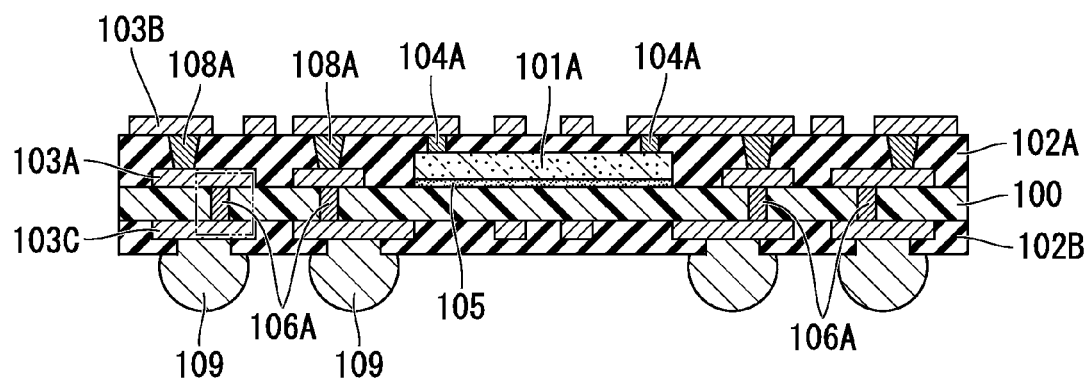
[FIG. 1] A sectional view of a first semiconductor device.

FIG. 1 is a sectional view of a first semiconductor device. In the first semiconductor device, a thinly-ground semiconductor element 101A is attached to a tabular silicon support body 100 via a bond 105. The semiconductor element 101A is embedded in an insulating layer 102A formed on one surface of the silicon support body 100. An insulating layer 103A is formed on one surface of the silicon support body 100, while an insulating layer 103B is formed on the upper surface of the insulating layer 102A opposite to the silicon support body 100. A pad (not shown) of the semiconductor element 101A is connected to a part of the wiring layer 103B via a connector 104A running through the insulating layer 102A. Additionally, the wiring layers 103A and 103B are electrically connected together via a connector 108A running through the insulating layer 102A.

A wiring layer 103C is formed on the other surface of the silicon support body 100 as well, wherein the wiring layer 103C is covered with an insulating layer 102B. A through-via 106A is arranged inside the silicon support body 100 so as to electrically connect the wiring layers 103A and 103C which are formed on the upper surface and the lower surface of the silicon support body 100. Additionally, an external terminal 109 is arranged via the wiring layer 103C and the insulating layer 102B.

For example, the semiconductor element 101A can be made of silicon, germanium, gallium arsenide (GaAs), gallium arsenide phosphorous, gallium nitride (GaN), silicon carbide (SiC), or zinc oxide (ZnO). Alternatively, it can be made of group II-IV compounds, group III-V compounds, or diamond, demonstrating other semiconductor property. These materials are illustrative and not restrictive. The first semiconductor device employs a silicon LSI chip as the semiconductor element 101A. It is possible to adjust the thickness of the semiconductor element 101A in response to the target thickness of a semiconductor device. Preferably, it is possible to determine the thickness of the semiconductor element 101A above 3 μm and below 30 μm. The first semiconductor device employs the semiconductor element 101A with the thickness of 15 μm and a chip size of 10 mm square. The first semiconductor device may incorporate a plurality of semiconductor elements 101A therein.

The insulating layers 102A and 102B are made of photosensitive or non-photosensitive organic materials. As organic materials, it is possible to use an epoxy resin, an epoxy acrylate resin, a urethane acrylate resin, a polyester resin, a phenol resin, a polyimide resin, BCB (Benzocylobutene), PBO (Polybenzoxazole), and poly-norbornane resin. Additionally, it is possible to use a resin-impregnated material with a woven cloth or a nonwoven cloth made of a glass cloth or an aramid fiber, a resin including inorganic fillers or organic fillers, and a silicon resin. These materials are illustrative and not restrictive. The first semiconductor device employs the insulating layers 102A and 102B made of an epoxy resin.

As the wiring layers 103A, 103B and 103C, for example, it is possible to use at least one metal, selected from among copper, silver, gold, nickel, aluminum, titanium, molybdenum, tungsten, and palladium, alloys mainly made of these metals, and a conductive resin made of a resin including conductive fillers. These materials are illustrative and not restrictive. In this connection, it is preferable that these layers be made of copper in terms of electrical resistance and cost. The first semiconductor device employs the wiring layers 103A, 103B and 103C made of copper.

As the bond 105, for example, it is possible to use a partially-cured resin called a die attachment film (DAF), an epoxy resin, a polyimide resin, BCB (Benzocyclobutene), a resin paste such as PBO (Polybenzoxazole), and a silver paste. These materials are illustrative and not restrictive. The first semiconductor device employs the bond 105 using DAF mainly made of an epoxy resin.

As the connector 104A, for example, it is possible to use a conductor, which is concurrently formed with the wiring layer 103B and embedded in a laser-opened via in the insulating layer 102A, or a metal bump which is arranged in the semiconductor element 101A in advance; but this is not a restriction. The first semiconductor device employs the connector 104A made of a copper bump.

Figure 36:
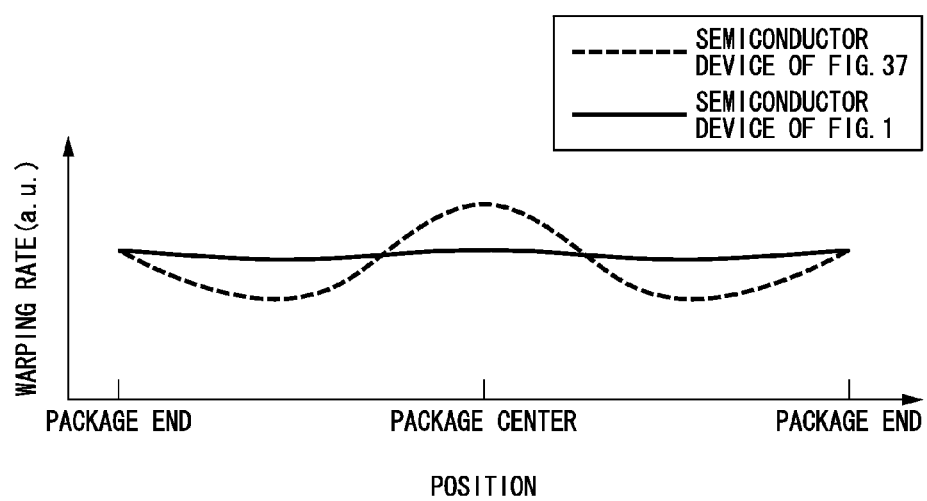
[FIG. 36] A graph showing a warping profile due to positional dependency of a warping rate of a semiconductor device.
Figure 37:
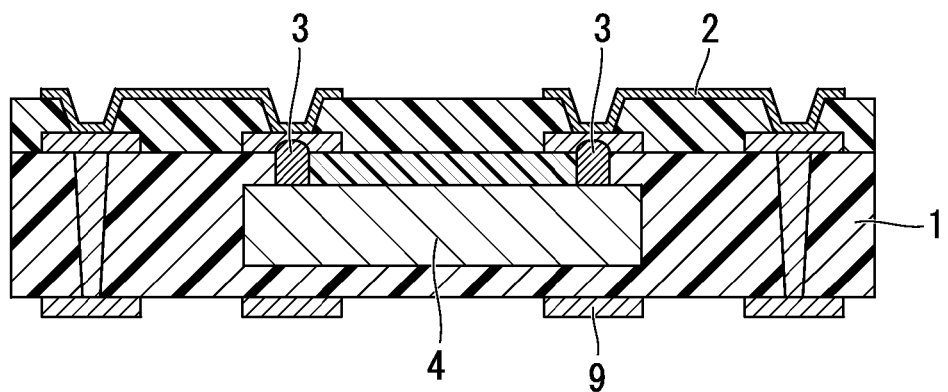
[FIG. 37] A sectional view showing the constitution of a semiconductor element incorporated substrate according to a conventional art.
Figure 38:
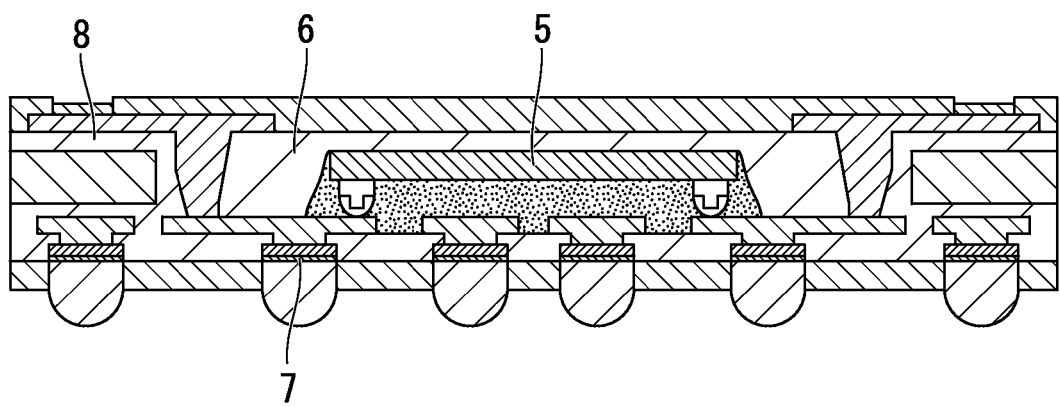
[FIG. 38] A sectional view showing the constitution of a semiconductor element incorporated substrate according to another conventional art.

Due to the existence of the silicon support body 100 demonstrating rigidity entirely in the lateral direction of the first semiconductor device shown in FIG. 1, it is possible to reduce a warping rate irrespective of thin thickness. Additionally, it is possible to significantly reduce a warping rate in the periphery of the semiconductor element 101A due to a very small difference (or a zero difference) of thermal expansion coefficients between the silicon support body 100 and the semiconductor element 101A. FIG. 36 shows a warping profile (see a solid line) of the first semiconductor device. Compared with the conventional art indicating the warping profile (see the dashed line) shown in FIG. 37, the first semiconductor device is able to achieve a warping rate which is one tenth or less.

A comparative assessment was conducted via a temperature cycling test (10 minutes maintenance in a temperature range of −55° C. to +125° C.) on the first semiconductor device, revealing the fact that a semiconductor device of the conventional art undergoes open defects during execution of about 500 cycles whilst the first semiconductor device undergoes no detects during execution up to 3,000 cycles.

Figure 2:
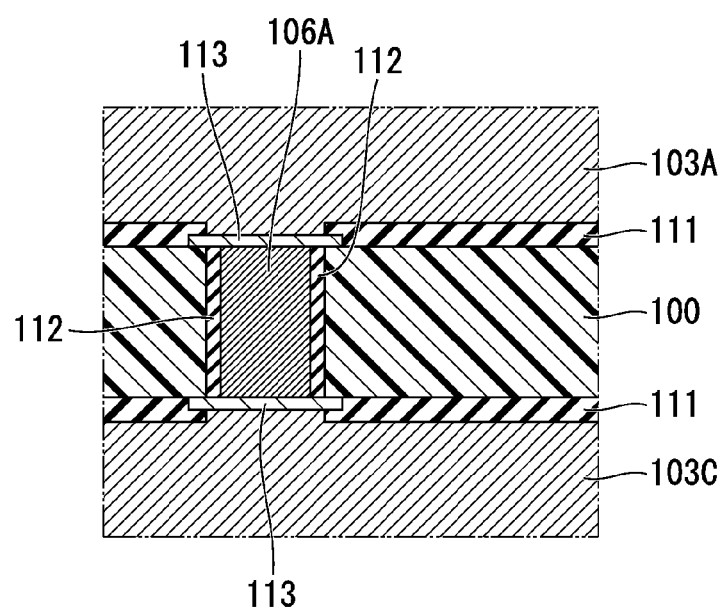
[FIG. 2] A sectional view showing the structure of a through-via formed in a silicon support body for arranging a semiconductor element in the first semiconductor device.

In FIG. 1, the detailed structure of the through-via 106A arranged inside the silicon support body 100 will be described with reference to FIGS. 2 and 3. As shown in FIG. 2, the through-via 106A has a structure in which an opening formed in the silicon support body 100 is filled with a conductor, whereas it is necessary to form a side insulating film 112 at the boundary between the conductor and the silicon indicating semiconductor property. Additionally, it is necessary to form a surface insulating film 111 at the interface between the silicon surface and the wiring layers 103A and 103C which are directly arranged on the silicon. It is possible to improve a reliability by way of a barrier metal 113 formed in the area electrically connecting the through-via 106A and the wiring layers 103A and 103C.

Figure 3:
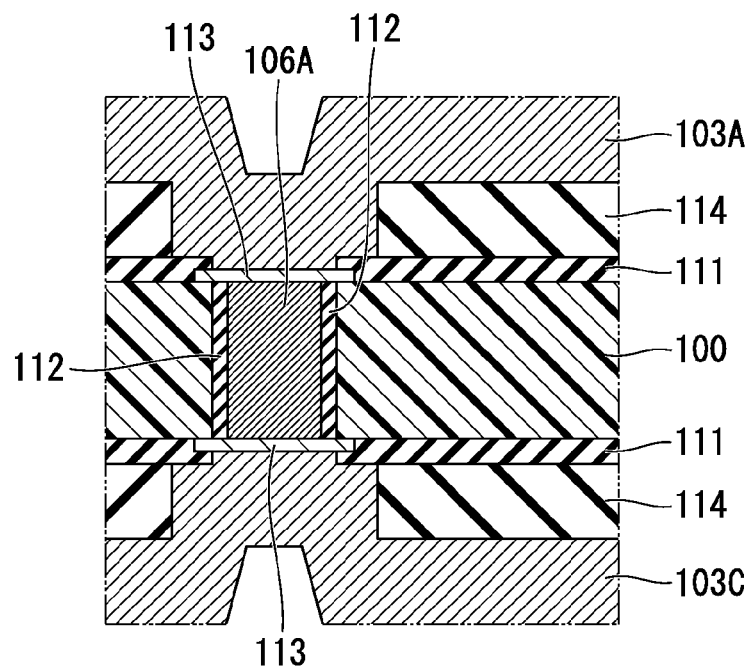
[FIG. 3] A sectional view showing another structure of a through-via of a silicon support body.

As shown in FIG. 3, it is possible to arrange a cover insulating film 114 before the formation of the wiring layers 103A and 103C on the opposite surfaces of the silicon support body 100 including the through-via 106A. This is needed to improve a handling ability while maintaining an adequate mechanical strength with respect to the silicon support body 100 with a small thickness of 100 µm or less. The cover insulating film 114 is made of a photosensitive or non-photosensitive organic material. As the organic material, for example, it is possible to use an epoxy resin, an epoxy acrylate resin, a urethane acrylate resin, a polyester resin, a phenol resin, a polyimide resin, BCB, PBO, and a poly-norbornane resin. Additionally, it is possible to use a resin-impregnated material with a woven cloth or a nonwoven cloth made of a glass cloth or an aramid fiber, a resin including inorganic fillers or organic fillers, and a silicon resin. These materials are illustrative and not restrictive. The first semiconductor device employs the cover insulating film 114 made of a photosensitive polyimide resin. In the description of a second semiconductor device onwards, the explanation regarding the detailed structure of the through-via 106A shown in FIGS. 2 and 3 will be omitted.

Next, a variety of variations based on the first semiconductor device will be described. In variations of this semiconductor device, the constituent elements common to the first semiconductor device are designated using the same reference signs so that their descriptions will be omitted, whilst the constituent elements different from the first semiconductor device will be described below.

(Second Semiconductor Device)

Figure 4:
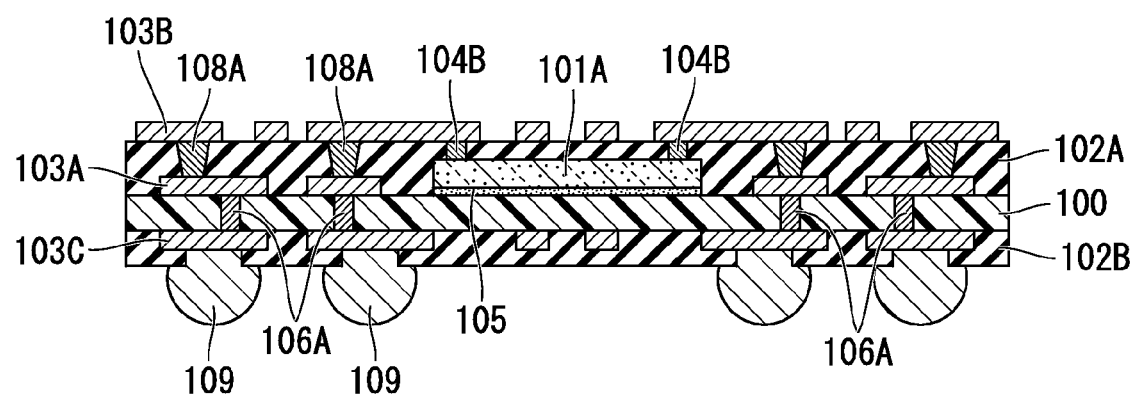
[FIG. 4] A sectional view of a second semiconductor device.

FIG. 4 is a sectional view of a second semiconductor device. The second semiconductor device differs from the first semiconductor device in that the semiconductor element 101A is connected to the wiring layer 103B by use of a connector 104B that applies copper (Cu) plating to a via which is formed by way of a laser-via method. The other constituent elements of the second semiconductor device are identical to those of the first semiconductor device.

Compared to the first semiconductor device using the connector 104A made of copper bumps, the second semiconductor device uses the connector 104B which does not need a special manufacturing process such as exposure and grinding for the formation of bumps; hence, it is possible to reduce a manufacturing cost.

(Third Semiconductor Device)

Figure 5:
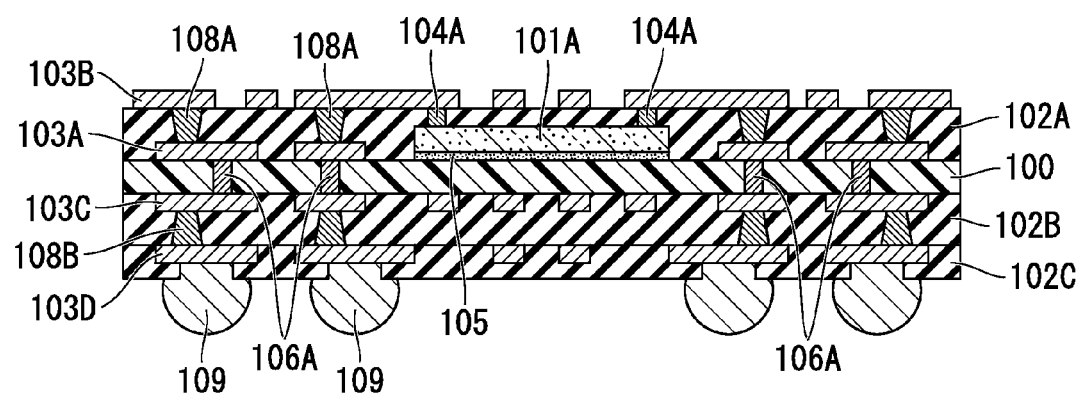
[FIG. 5] A sectional view of a third semiconductor device.

FIG. 5 is a sectional view of a third semiconductor device. In the third semiconductor device, a wiring layer 103D is formed on the surface of the insulating layer 102B at the side of the external terminal 109 of the silicon support body 100. The third semiconductor device has a two-layered structure including the wiring layers 103C and 103D. The wiring layer 103D is covered with the insulating layer 102C. The wiring layers 103C and 103D are electrically connected together via a connector 108B running through the insulating layer 102B. The external terminal 109 is arranged via the wiring layer 103D and the insulating layer 102C.

(Fourth Semiconductor Device)

Figure 6:
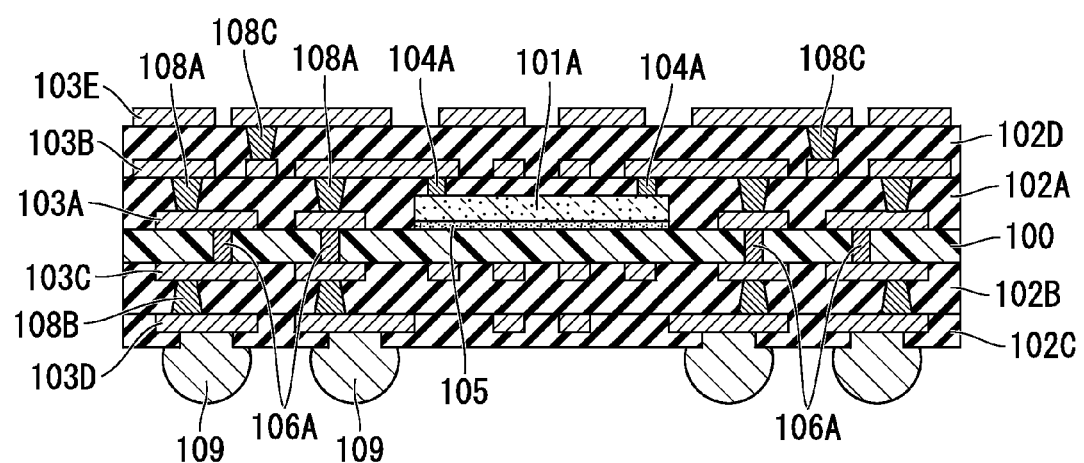
[FIG. 6] A sectional view of a fourth semiconductor device.

FIG. 6 is a sectional view of a fourth semiconductor device. The fourth semiconductor device has a six-layered structure including a further wiring layer 103E in addition to the wiring layers 103A and 103B at the side of the semiconductor element 101A of the silicon support body 100. The wiring layer 103B is covered with the insulating layer 102D while the wiring layer 103E is formed on the surface of the insulating layer 102D. Additionally, the wiring layers 103B and 103E are electrically connected together via a connector 108C running through the insulating layer 102D.

As illustrated with the third semiconductor device and the fourth semiconductor device, it is possible to employ a multilayered structure, regarding a pair of the insulating layer 102 and the wiring layer 103, as necessary. The increased number of layers in the multilayered structure leads to a high wiring capacity, thus accommodating the semiconductor element 101 with a more number of pins via small pitches. Additionally, a certain pattern of the wiring layer 103 may suppress a warping rate in the entirety of a semiconductor device; hence, it is possible produce semiconductor devices with good flatness and a superior secondary packaging ability.

(Fifth Semiconductor Device)

Figure 7:
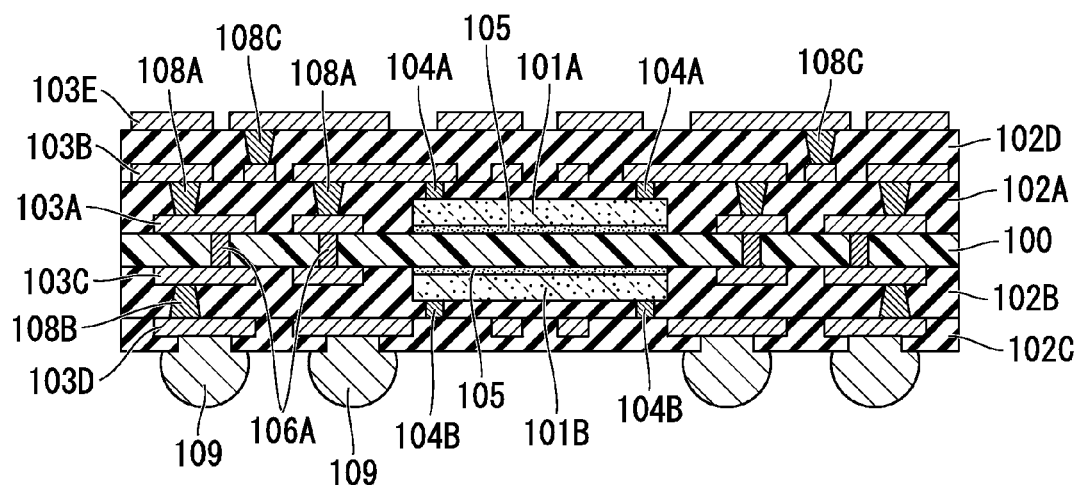
[FIG. 7] A sectional view of a fifth semiconductor device.

FIG. 7 is a sectional view of a fifth semiconductor device. In the fifth semiconductor device, a plurality of semiconductor elements 101A and 101B is attached to the opposite surfaces of the silicon support body 100. Adhesive layers 105 are applied to the backsides of the semiconductor elements 101A and 101B, which are bonded to one surface and the other surface of the silicon support body 100. A pad (not shown) of the semiconductor element 101B is connected to a part of the wiring layer 103D via the connector 104B running through the insulating layer 102B.

Thus, a single semiconductor device is able to carry out complex signal processing by incorporating a plurality of semiconductor elements 101A and 101B. Compared to the foregoing semiconductor device incorporating the semiconductor element 101A on one surface of the silicon support body 100, the fifth semiconductor device has a vertically symmetrical structure, thus further reducing a warping rate. In this connection, the embedded positions of the semiconductor elements 101A and 101B are not limited to the positions shown in FIG. 7.

(Sixth Semiconductor Device)

Figure 8:
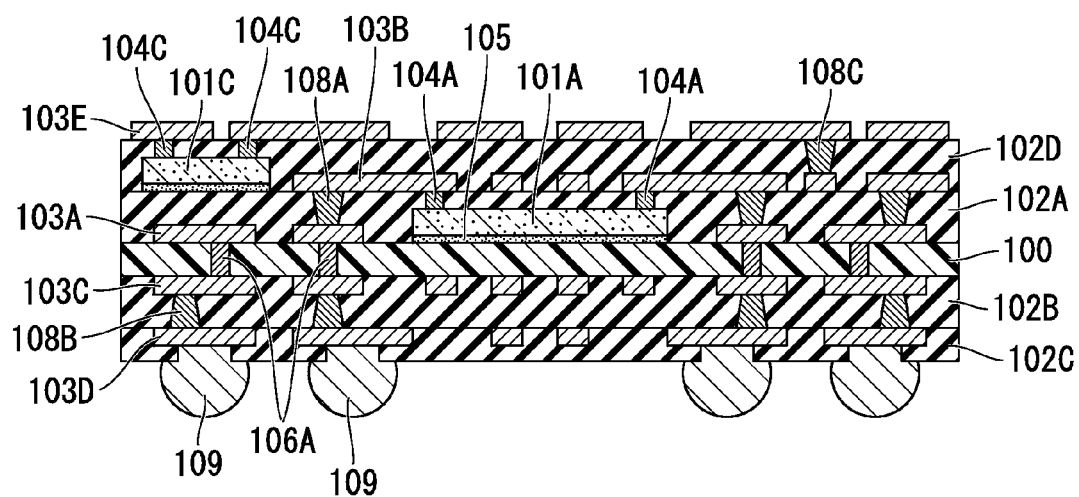
[FIG. 8] A sectional view of a sixth semiconductor device.

FIG. 8 is a sectional view of a sixth semiconductor device. The sixth semiconductor device further includes a semiconductor element 101C, whose thickness is smaller than the thickness of the semiconductor element 101A and which is arranged independently of the semiconductor element 101A, wherein the semiconductor element 101C is embedded in an insulating layer (e.g. an insulating layer 102D) which is distanced from the silicon support body 100. A pad (not shown) of the semiconductor element 101C is connected to a part of the wiring layer 103E via a connector 104C running through the insulating layer 102D.

It is preferable that the semiconductor element 101C having a small chip size be embedded in the insulating layer 102D distanced from the silicon support body 100 in order to suppress a warping rate of the entirety of a semiconductor device. Thus, a single semiconductor device is able to carry out complex signal processing by incorporating a plurality of semiconductor elements.

In this connection, the position of the semiconductor element 101C embedded in the insulating layer 102D is not limited to the position shown in FIG. 8.

(Seventh Semiconductor Device)

Figure 9:
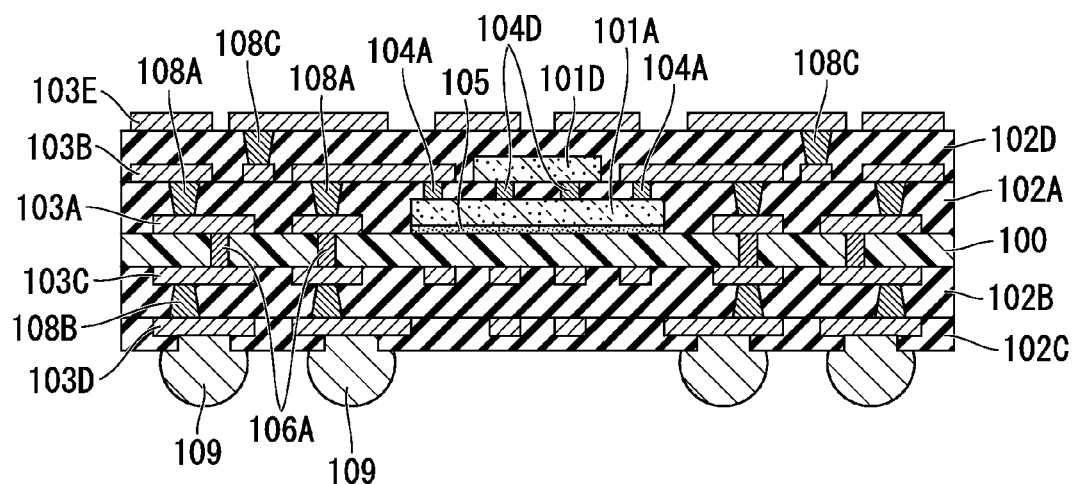
[FIG. 9] A sectional view of a seventh semiconductor device.

FIG. 9 is a sectional view of a seventh semiconductor device. The seventh semiconductor device employs a face-to-face structure, in which a semiconductor element 101D, which is arranged independently of the semiconductor element 101A, is positioned opposite to the semiconductor element 101A with a gap therebetween. A pad (not shown) of the semiconductor element 101D is connected to a part of the semiconductor element 101A via a connector 104D running through the insulating layer 102A.

The structure shown in FIG. 9 may improve a transmission speed between the two semiconductor elements 101A and 101D, thus enabling further high-speed signal processing with a semiconductor device.

(Eighth Semiconductor Device, Ninth Semiconductor Device)

Figure 10:
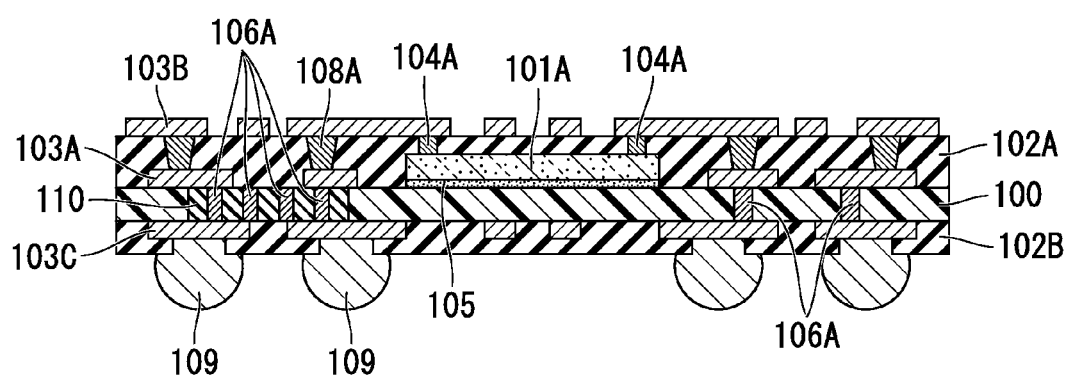
[FIG. 10] A sectional view of an eighth semiconductor device.
Figure 11:
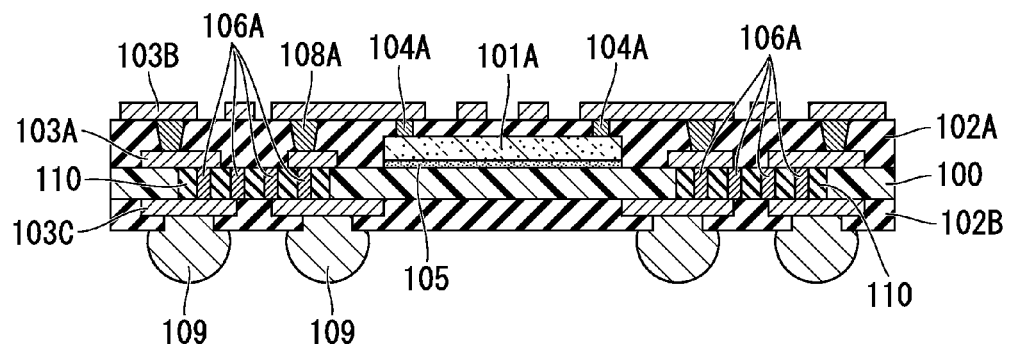
[FIG. 11] A sectional view of a ninth semiconductor device.

FIG. 10 is a sectional view of an eighth semiconductor device, and FIG. 11 is a sectional view of a ninth semiconductor device.

In the eighth semiconductor device and the ninth semiconductor device, the silicon support body 100 includes an embedded insulator 10, which further contains a plurality of through-vias 106A, by which the wiring layers 103A, 103B and 103C are mutually connected together. The eighth semiconductor device shown in FIG. 10 includes through-vias 106A not associated to the embedded insulator 110, whilst the ninth semiconductor device shown in FIG. 11 includes a plurality of through-vias 106A, all of which are arranged insides the embedded insulators 110.

The detailed structure of the through-via 106A not associated to the embedded insulator 110 are shown in FIGS. 2 and 3, wherein the embedded insulator 110, adopted to the eighth semiconductor device and the ninth semiconductor device, is formed in such a way that, for example, an insulating film is embedded in a through-hole of the silicon support body 100 with a diameter of about 500 µm. The embedded insulating film is made of a photosensitive or non-photosensitive organic material. As the organic material, for example, it is possible to use an epoxy resin, an epoxy acrylate resin, a urethane acrylate resin, a polyester resin, a phenol resin, a polyimide resin, BCB, PBO, and poly-norbornane resin. Additionally, it is possible to use a resin-impregnated material with a woven cloth or a nonwoven cloth made of a glass cloth or an aramid fiber, a resin including inorganic fillers or organic fillers, and a silicon resin. These materials are illustrative and not restrictive. The eighth semiconductor device and the ninth semiconductor device use a photosensitive polyimide resin for an insulating film.

Compared to the foregoing semiconductor device using the through-via 106A shown in FIGS. 2 and 3, the eighth semiconductor device and the ninth semiconductor device can reduce a stray capacitance for each single through-via 106A owing to a large distance between the silicon support body 100 and a insulating film in a lateral direction (i.e. a direction parallel to the surface of the silicon support body 100). Therefore, it is possible to improve the quality of signals passing through the through-via 106A, thus capacitating a semiconductor device to cope with further high-frequency signals. Additionally, it is possible to reduce the manufacturing cost because the manufacturing process of the through-via 106A does not need the side insulating film 112 using a very thin insulating film.

(Tenth Semiconductor Device, Eleventh Semiconductor Device)

Figure 12:
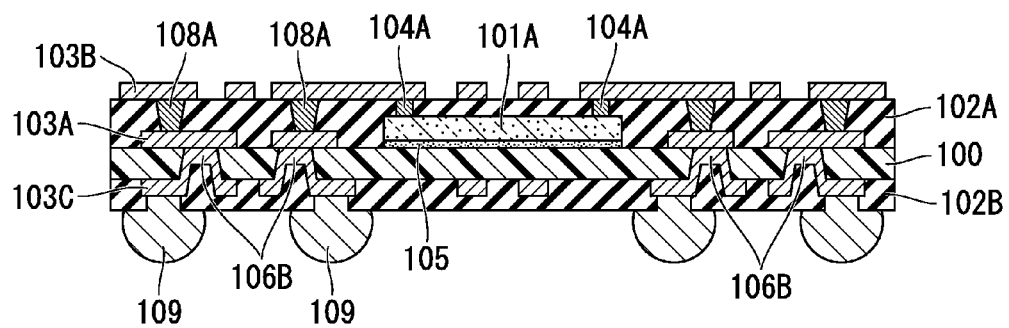
[FIG. 12] A sectional view of a tenth semiconductor device.
Figure 13:
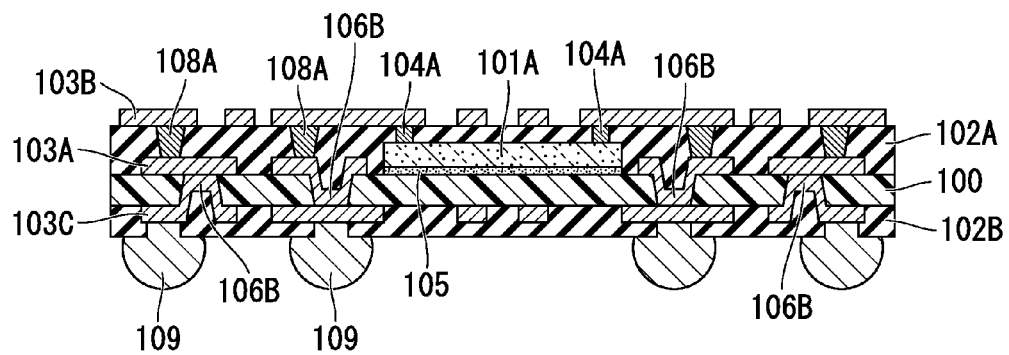
[FIG. 13] A sectional view of an eleventh semiconductor device.

FIG. 12 is a sectional view of a tenth semiconductor device, and FIG. 13 is a sectional view of an eleventh semiconductor device. In the tenth semiconductor device and the eleventh semiconductor device, a through-via 106B is arranged in the silicon support body 100. The through-via 106B electrically connects the wiring layers 103A and 103C on the opposite surfaces of the silicon support body 100.

The tenth semiconductor device employs the through-via 106B having a half-filled via structure, in which a silicon opening area is filled with a conductor up to its midway while the remaining opening area is filled with the insulating layer 102B, instead of the through-via 106A having a filled via structure in which a silicon opening area is entirely filled with a conductor. Herein, the through-via 106B may employ a bowl-like sectional shape in which the diameter thereof gradually increases in a direction from the wiring layer 103a to the wiring layer 103C.

The half-filled via structure makes it possible to further reduce the manufacturing process of the through-via 106B, wherein it is possible to reduce a warping rate, compared to the filled via structure, because the insulating layer 102B reduces partial stress concentrated at the through-via 106B.

Compared to the tenth semiconductor device, the eleventh semiconductor device may vertically change the opening direction of the through-via 106B with the half-filled via structure. Thus, it is possible to effectively reduce a warping rate by changing the opening direction of the half-filled via structure.

In the foregoing semiconductor devices, it is possible to set the same thickness to both the insulating layer and the silicon support body, or it is possible to set different thicknesses to them. It is preferable that the thickness of the insulating layer 102A incorporating a semiconductor element be thinner than the maximum thickness among the other insulating layers 102B, 102C and 102D. This realizes a minimum thickness for the insulating layer 102A while applying a thick film structure to the other insulating layers 102B, 102C and 102D, thus simplifying the manufacturing process and reducing the manufacturing cost.

(Basic Manufacturing Method of Semiconductor Device)

Next, a manufacturing method of a semiconductor device according to the present invention will be described. First, a basic manufacturing method of the first semiconductor device will be described with reference to FIGS. 14 to 19.

Figure 14:
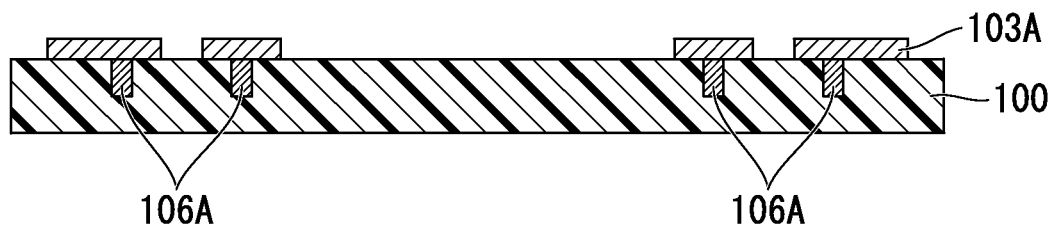
[FIG. 14] A sectional view showing a basic manufacturing method of the first semiconductor device, illustrating a process for forming a through-via in a silicon support body for forming a wiring layer.

As shown in FIG. 14, an opening is formed at a desired area of the silicon support body 100 so as to form the through-via 106; then, the wiring layer 103A is formed. At this time, it is possible to form a positional mark (not shown) for mounting the semiconductor element 101A as necessary. Herein, electrical plating is carried out to form a nickel with a thickness of 5 μm as a positional mark. In this connection, insulation is secured between the silicon support body 100 and the wiring layer 103A or between the silicon support body 100 and the through-via 106 in accordance with the normal thermal oxidation method in which an silicon oxide film is formed on the surface of the silicon support body 100 or the wall of the through-via 106, wherein the silicon oxide film is not shown in the drawings.

Figure 15:
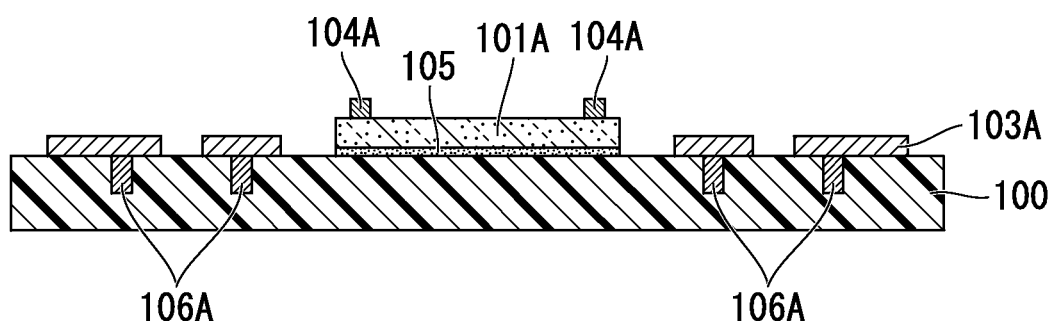
[FIG. 15] A sectional view showing a process for mounting a semiconductor element on the silicon support body, subsequent to FIG. 14.

Next, as shown in FIG. 15, a semiconductor mounting device (not shown) arranges the semiconductor element 101A at a desired position in a face-up state. In this connection, a single semiconductor element 101A can be incorporated into a semiconductor device; alternatively, a plurality of semiconductor elements 101A can be incorporated into a semiconductor device. The semiconductor element 101A is equipped with a metal post serving as the connector 104A in advance. The principal component of a metal post is one metal element or plural metal elements, selected from among copper, silver, gold, nickel, aluminum, titanium, molybdenum, tungsten, and palladium. Herein, copper is selected as the principal component of a metal post in consideration of the manufacturing cost.

Figure 16:
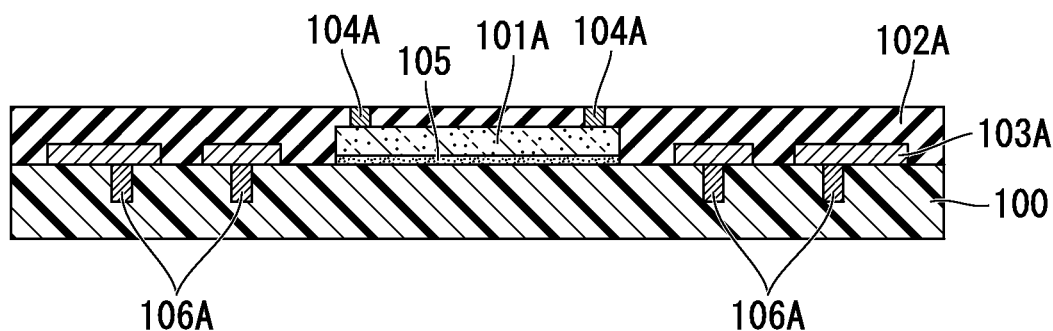
[FIG. 16] A sectional view showing a process for forming an insulating layer embedding the semiconductor element on the silicon support body, subsequent to FIG. 15.

Subsequently, as shown in FIG. 16, the semiconductor element 101A is embedded in the insulating layer 102A. As a method for embedding the semiconductor element 101A with the material of the insulating layer 102A, for example, it is possible to use a transfer molding method, a compression molding method, a printing method, a vacuum press method, a vacuum lamination method, a spin-coat method, a die-coat method, a curtain-coat method, and a photolithography method. Herein, an epoxy resin is formed according to a vacuum lamination method. Before the molding of the insulating layer 102A, it is possible to form a recess in conformity with the semiconductor element 101A. In order to increase the thickness of the insulating layer 102A, it is necessary to perform grinding on the insulating layer, thus exposing the connector 104A. In this connection, it is possible to form an opening in accordance with a laser processing method instead of grinding.

Figure 17:
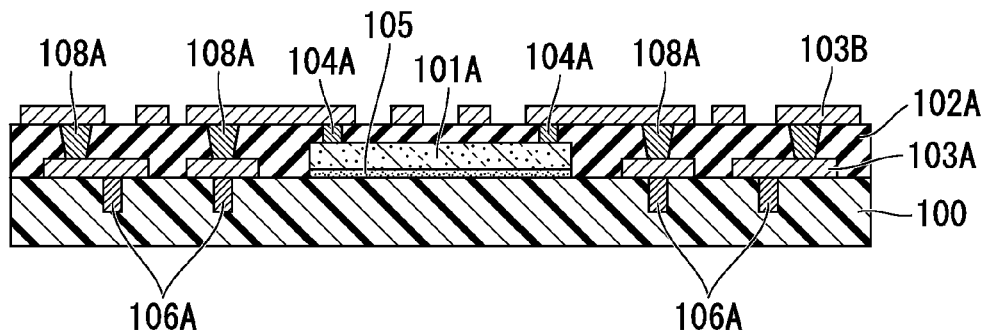
[FIG. 17] A sectional view showing a process for forming a connector in the insulating layer and for forming a wiring layer on the insulating layer, subsequent to FIG. 16.

Moreover, as shown in FIG. 17, the connector 108A and the wiring layer 103B are formed to connect the semiconductor element 101A to the wiring layer 103A.

When the insulating layer 102A is made of a photosensitive material, it is possible to form the connector 108A in accordance with the photolithography method. When the insulating layer 102A is made of a non-photosensitive material, or when it is made of a photosensitive material with a low resolution, for example, it is possible to form the opening in accordance with the laser processing method, the dry etching method, or the blasting method. Herein, the opening is formed according to the laser processing method. The principal component of a conductor filled inside the connector 108A is one metal element or plural metal elements, selected from among copper, silver, gold, nickel, aluminum, titanium, molybdenum, tungsten, and palladium. As a filling method of a conductor, for example, it is possible to use an electrical plating method, an electroless plating method, a printing method, or a dissolved metal suction method.

Additionally, the wiring layer 103B is formed according to a subtractive method, a semi-additive method, or a full-additive method. The subtractive method is a method in which a resist of a desired pattern is formed on a copper foil disposed on a substrate; an unwanted portion of a copper foil is etched; then, the resist is peeled off so as to form a desired pattern. The semi-additive method is a method in which a feeder layer is formed according to an electroless plating method, a sputtering method, or a CVD (Chemical Vapor Deposition) method; a resist with an opening of a desired pattern is formed; a metal is deposited inside the opening of a resist according to the electroless plating method; the resist is removed; then, the feeder layer is etched so as to form a desired wiring pattern. The full-additive method is a method in which an electroless plating catalyst is adsorbed onto a substrate; a resist pattern is formed; the catalyst is activated while the resist is maintained as an insulating film; then, a metal is disposed in the opening of the insulating film according to the electroless plating method, thus forming a desired wiring pattern. Herein, the wiring layer 103B is formed according to the semi-additive method using copper.

Figure 18:
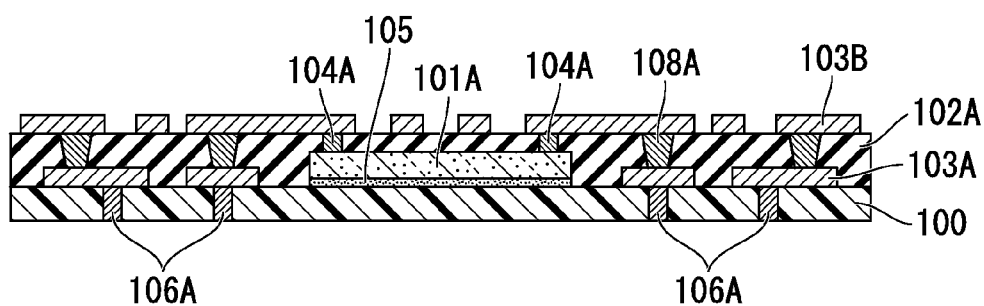
[FIG. 18] A sectional view showing a process for reducing the thickness of the silicon support body to the final thickness, subsequent to FIG. 17.

Next, as shown in FIG. 18, the thickness of the silicon support body 100 is reduced from its backside so as to expose the through-via 106. As a method of reducing the thickness of the silicon support body 100, it is possible to use an etching method and a sandblasting method other than the normal grinding method; but this is not a restriction.

Figure 19:
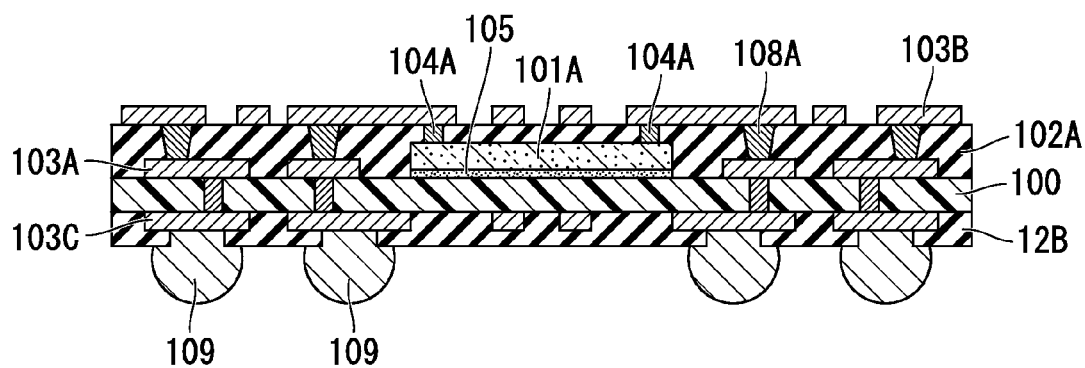
[FIG. 19] A sectional view showing a process for arranging an insulating layer, a wiring layer, and an external terminal on the backside of the silicon support body, subsequent to FIG. 18.

Lastly, as shown in FIG. 19, the insulating layer 102B, the wiring layer 103C, and the external terminal 109 are formed on the backside of the silicon support body 100, thus completing the production of a semiconductor device.

Next, a basic manufacturing method of the tenth semiconductor device shown in FIG. 12 will be described with reference to FIGS. 20 to 25.

Figure 20:
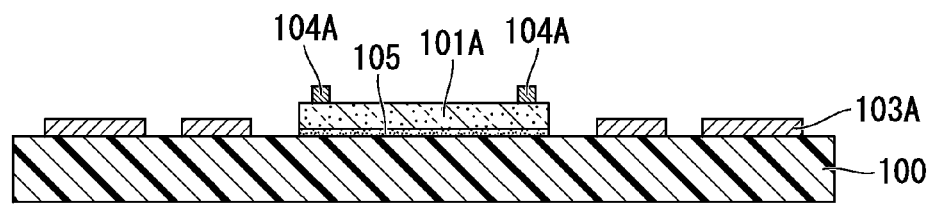
[FIG. 20] A sectional view showing a basic manufacturing method of the tenth semiconductor device, illustrating a process for mounting a semiconductor element on a silicon support body.

First, as shown in FIG. 20, the wiring layer 103A is formed in a desired area of the silicon support body 100. At this time, it is possible to form a positional mark (not shown) for mounting the semiconductor element 101A as necessary. Herein, electrical plating is performed to form a nickel with a thickness of 5 μm as a positional mark.

Figure 21:
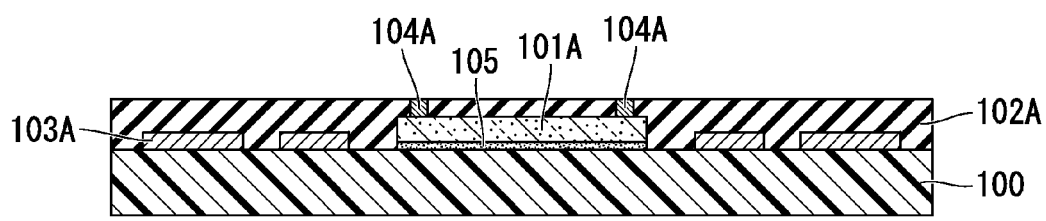
[FIG. 21] A sectional view showing a process for forming an insulating layer embedding a semiconductor element on the silicon support body, subsequent to FIG. 20.

A semiconductor mounting device (not shown) arranges the semiconductor element 101A at a desired position on the silicon support body 100 in a face-up state. Next, as shown in FIG. 21, the semiconductor element 101A is embedded in the insulating layer 102A on the silicon support body 100. The detailed explanation regarding the semiconductor element 101A and the insulating layer 102 will be omitted because it is identical to the aforementioned explanation regarding the basic manufacturing method of a semiconductor device.

Figure 22:
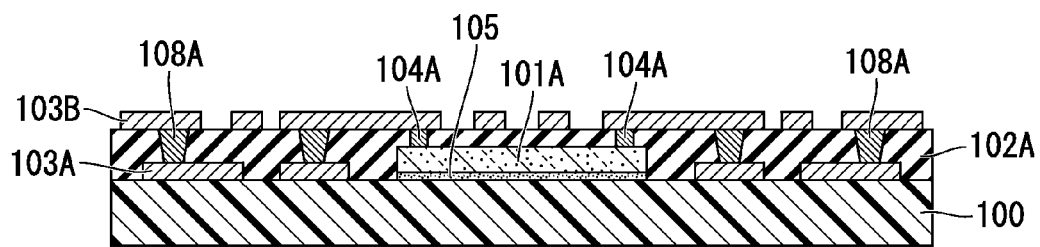
[FIG. 22] A sectional view showing a process for forming a connector in the insulating layer and for forming a wiring layer on the insulating layer, subsequent to FIG. 21.

Moreover, as shown in FIG. 22, the connector 108A and the wiring layer 103B are formed to connect the semiconductor element 101A to the wiring layer 103A. The detailed explanation of the connector 108A will be omitted because it is identical to the aforementioned explanation regarding the basic manufacturing method of a semiconductor device.

Figure 23:
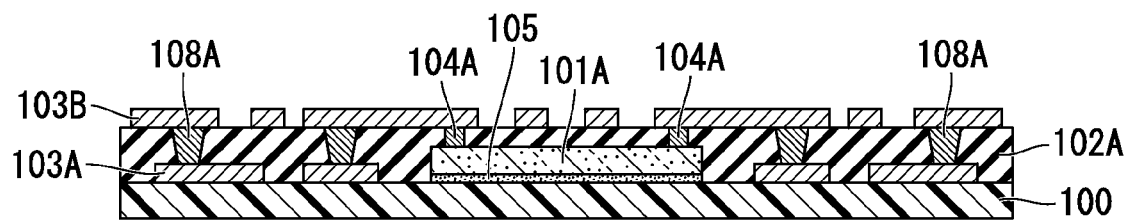
[FIG. 23] A sectional view showing a process for reducing the thickness of the silicon support body to the final thickness, subsequent to FIG. 22.

Subsequently, as shown in FIG. 23, the thickness of the silicon support body 100 is reduced from its backside. As a method of reducing the thickness of the silicon support body 100, it is possible to use an etching method and a sandblasting method other than the normal grinding method; but this is not a restriction. Herein, the grinding method is adopted.

Figure 24:
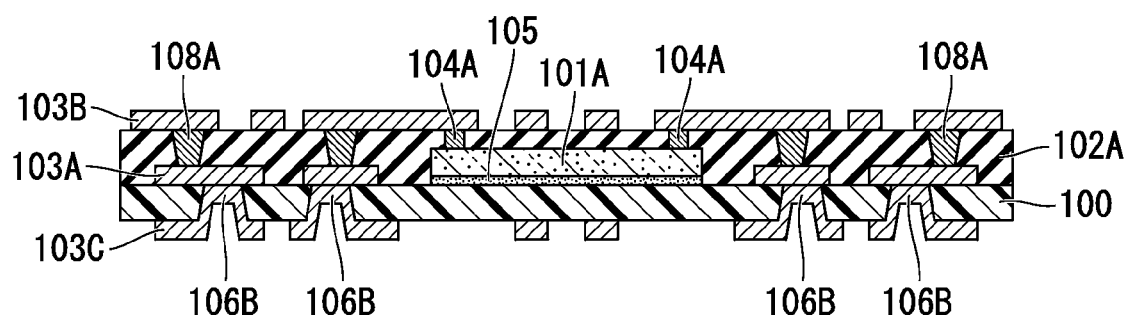
[FIG. 24] A sectional view showing a process for arranging a through-via, having a half-filled via structure, on the backside of the silicon support body, subsequent to FIG. 23.

Next, as shown in FIG. 24, the through-via 106B is formed at a desired position of the silicon support body 100. The through-via 106B has a half-filled via structure in which its inside is not completely filled with a conductor.

Figure 25:
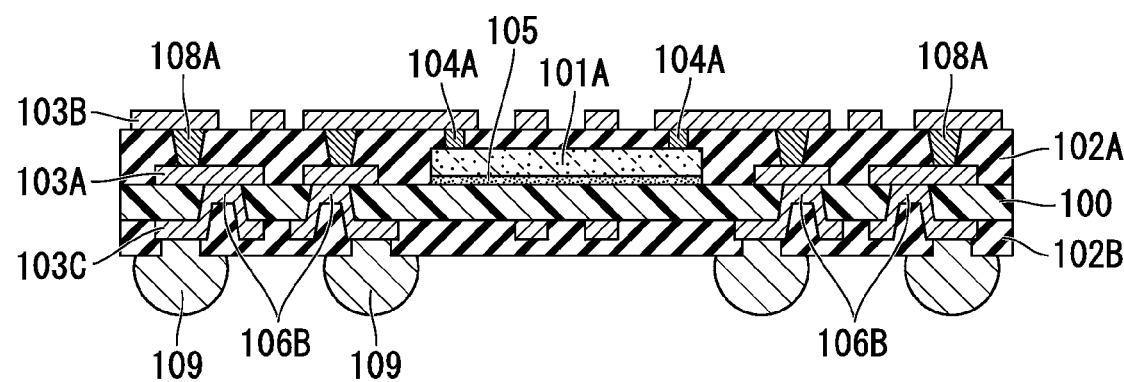
[FIG. 25] A sectional view showing a process for arranging an insulating layer, a wiring layer, and an external terminal on the backside of the silicon support body, subsequent to FIG. 24.

Lastly, as shown in FIG. 25, the insulating layer 102B and the external terminal 109 are formed so as to complete the production of a semiconductor device.

First Embodiment

Next, a manufacturing method of a semiconductor device according to a first embodiment of the present invention will be described with reference to FIGS. 26 to 30.

Figure 26:
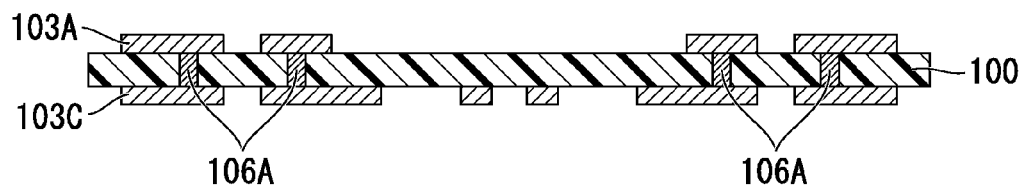
[FIG. 26] A sectional view showing a manufacturing method of a semiconductor device according to a first embodiment of the present invention, illustrating a process for forming a through-via and a wiring layer in a silicon support body whose thickness is already reduced to the final thickness.

First, as shown in FIG. 26, the thickness of the silicon support body 100 is reduced to the final thickness; then, the through-via 106A and the wiring layers 103A, 103C are formed in desired areas. At this time, it is possible to form a positional mark (not shown) for mounting the semiconductor element 101A as necessary.

Figure 27:
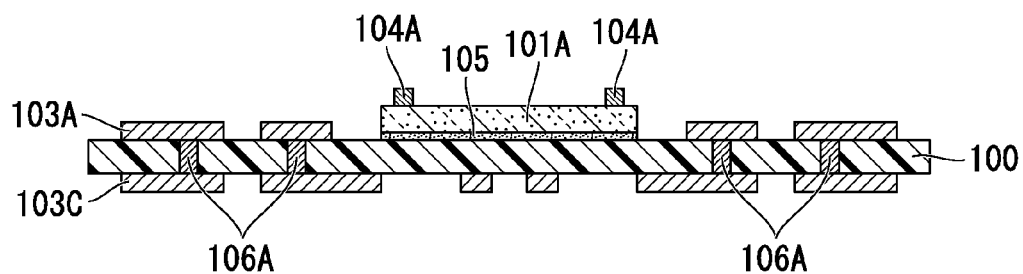
[FIG. 27] A sectional view showing a process for mounting a semiconductor element on the silicon support body, subsequent to FIG. 26.
Figure 28:
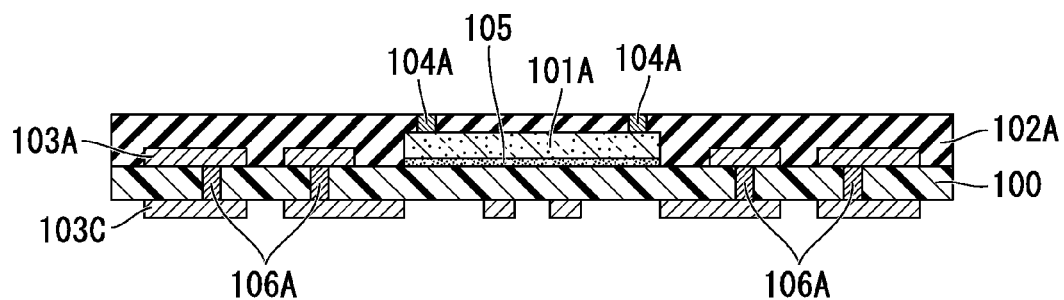
[FIG. 28] A sectional view showing a process for forming an insulating layer embedding a semiconductor element on the silicon support body, subsequent to FIG. 27.

Next, as shown in FIG. 27, a semiconductor mounting device (not shown) arranges the semiconductor element 101A at a desired position on the silicon support body 100 in a face-up state. As shown in FIG. 28, the semiconductor element 101A is embedded in the insulating layer 102A on the silicon support body 100. Herein, the detailed explanation regarding the semiconductor element 101A and the insulating layer 102A will be omitted because it is identical to the aforementioned explanation regarding the basic manufacturing method of a semiconductor device.

Figure 29:
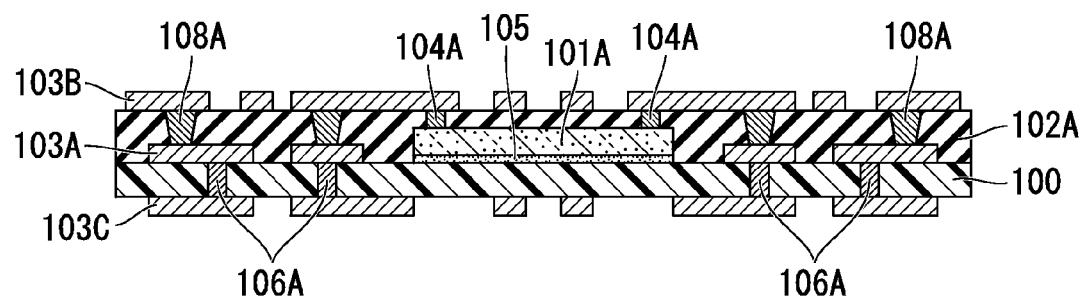
[FIG. 29] A sectional view showing a process for forming a connector in the insulating layer and for forming a wiring layer on the insulating layer, subsequent to FIG. 28.

Moreover, as shown in FIG. 29, the connector 108A and the wiring layer 103B are arranged to connect the semiconductor element 101A to the wiring layer 103A. The detailed explanation regarding the connector 108A will be omitted because it is identical to the explanation regarding the basic manufacturing method of the foregoing semiconductor devices.

Figure 30:
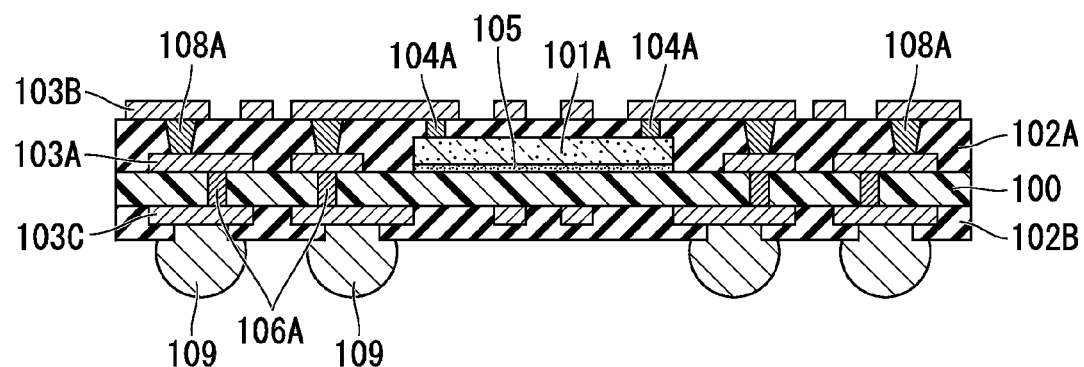
[FIG. 30] A sectional view showing a process for forming an insulating layer, a wiring layer, and an external terminal on the backside of the silicon support body, subsequent to FIG. 29.

Subsequently, as shown in FIG. 30, the insulating layer 102B and the external terminal 109 are formed on the backside of the silicon support body 100, thus completing the production of a semiconductor device.

As shown in the warping profile of FIG. 36 (see a solid line), the warping rate of a semiconductor device produced via the manufacturing method of the first embodiment appears to be a small value. This makes it possible to mount the semiconductor element 101A on the silicon support body 100 whose thickness is reduced to the final thickness in advance and which is equipped with the through-via 106A and the wiring layer 103A. Thus, it is possible to inspect the connected condition between the through-via 106A and the wiring layer 103A before the mounting of the semiconductor element 101A. Therefore, it is possible to reduce a risk of discarding the semiconductor element 101A with good quality and therefore improve a yield rate in manufacturing semiconductor devices because the above method ensures the semiconductor element 101A to be mounted at a good position which has been inspected well.

Second Embodiment

Next, a manufacturing method of a semiconductor device according to a second embodiment of the present invention will be described with reference to FIGS. 31 to 35.

Figure 31:
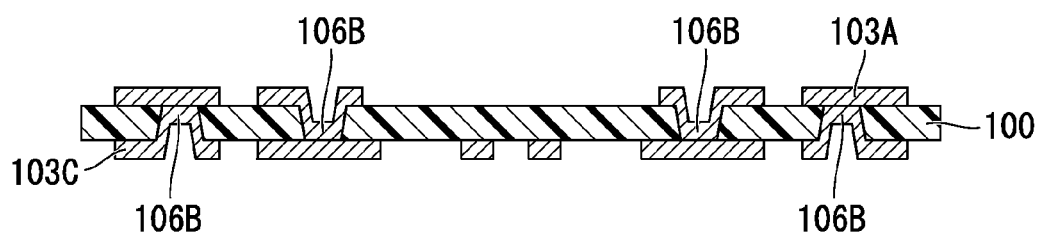
[FIG. 31] A sectional view showing a manufacturing method of a semiconductor device according to a second embodiment of the present invention, illustrating a process for forming a through-via and a wiring layer in the silicon support body whose thickness is already reduced to the final thickness.

First, as shown in FIG. 31, the thickness of the silicon support body 100 is reduced to the final thickness in advance; then, the through-via 106B and the wiring layers 103A and 103C are formed in desired areas. At this time, it is possible to form a positional mark (not shown) for mounting the semiconductor element 101A as necessary. Additionally, the through-via 106B has a half-filled via structure in which the inside thereof is not perfectly filled with a conductor. The through-vias 106B having the half-filled via structure are not necessarily formed in the direction as shown in FIG. 12 in which their openings are collectively formed on one surface of the silicon support body 100; hence, they can be formed in an either direction for the opposite surfaces of the silicon support body 100 shown in FIG. 13.

Figure 32:
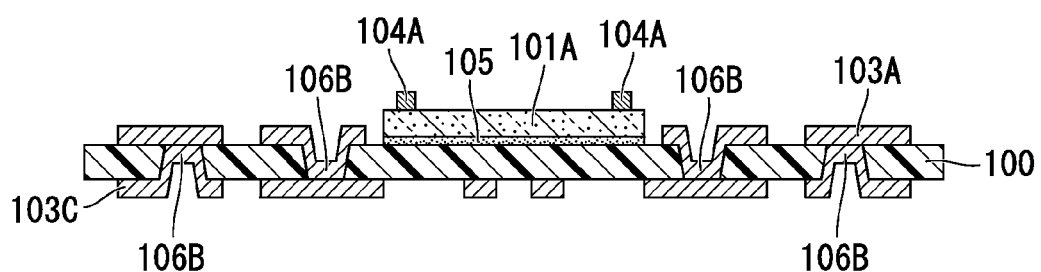
[FIG. 32] A sectional view showing a process for mounting a semiconductor element on the silicon support body, subsequent to FIG. 31.
Figure 33:
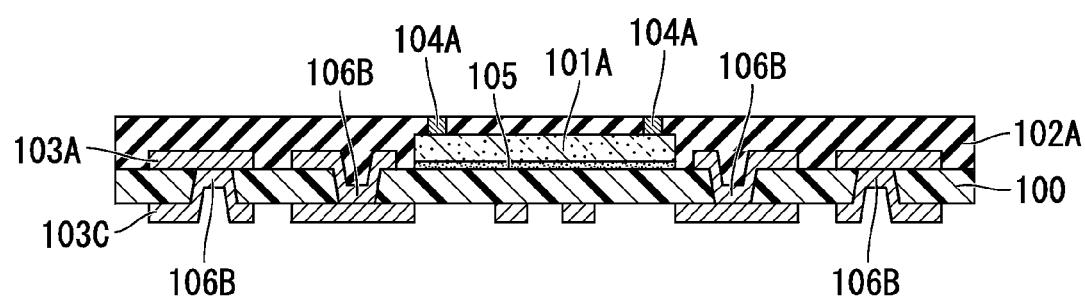
[FIG. 33] A sectional view showing a process for forming an insulating layer embedding a semiconductor element on the silicon support body, subsequent to FIG. 32.

Next, as shown in FIG. 32, a semiconductor mounting device (not shown) arranges the semiconductor element 101A at a desired position in a face-up state. As shown in FIG. 33, the semiconductor element 101A is embedded in the insulating layer 102A on the silicon support body 100. The detailed explanation regarding the semiconductor element 101A and the insulating layer 102A will be omitted because it is identical to the explanation regarding the basic manufacturing method of the foregoing semiconductor devices.

Figure 34:
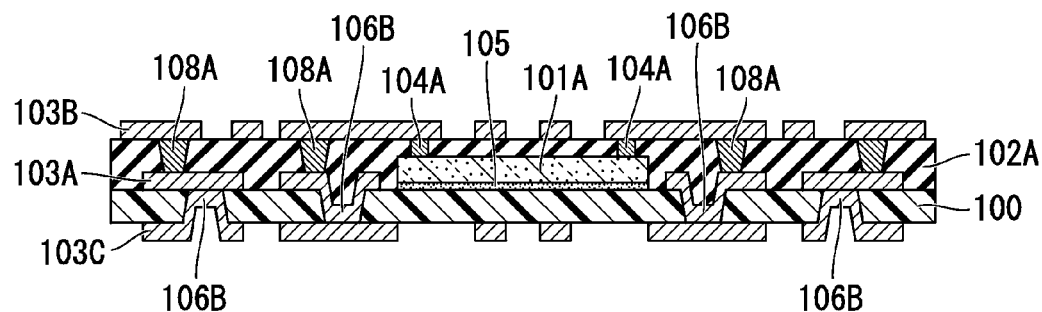
[FIG. 34] A sectional view showing a process for forming a connector in the insulating layer and for forming a wiring layer on the insulating layer, subsequent to FIG. 33.

Moreover, as shown in FIG. 34, the connector 108A and the wiring layer 103B are formed to connect the semiconductor element 101A to the wiring layer 103A. The explanation regarding the connector 108A will be omitted because it is identical to the explanation regarding the basic manufacturing method of the foregoing semiconductor devices.

Figure 35:
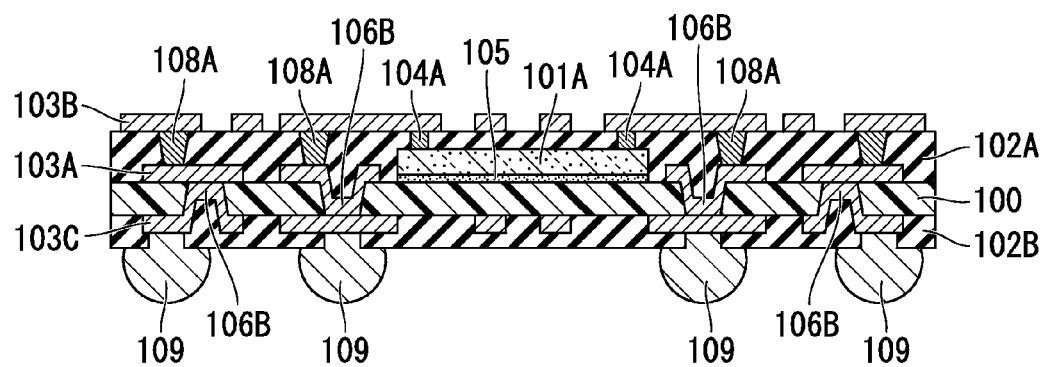
[FIG. 35] A sectional view showing a process for forming an insulating layer, a wiring layer, and an external terminal on the backside of the silicon support body, subsequent to FIG. 34.

Subsequently, as shown in FIG. 35, the insulating layer 102B and the external terminal 109 are formed on the backside of the silicon support body 100, thus completing the production of a semiconductor device.

As shown in the warping profile (see a solid line) of FIG. 36, the warping rate of a semiconductor device produced via the manufacturing method of the second embodiment appears to be a small value. Upon controlling the position of a half-filled via structure and the direction of a via-opening, it is possible to further reduce a local warping factor of a semiconductor device.

As described above, the semiconductor devices produced via the manufacturing methods of the foregoing embodiments may be each reduced in the warping and swelling in the periphery of an incorporated semiconductor element, and therefore they are improved in reliability.

The present invention is not necessarily limited to the foregoing embodiments; hence, it is possible to invent a variety of variations within the technological scope as defined in the appended claims.

For example, a semiconductor device may include a LCR (Inductance-Capacitance-Resistance) component serving as a noise filter of circuitry at a desired position of multilayered wiring. As a dielectric material configuring a capacitor, it is possible to use a metal oxide such as titanium oxide, tantalum oxide, $Al_2O_3$, $SiO_2$, $ZrO_2$, $HfO_2$, and $Nb_2O_5$, perovskite materials such as BST ((Bax, Sr1-x) TiO$_3$), PZT (Pb(Zrx,Ti1-x)O$_3$), and PLZT ((Pb1-y, Lay) (Zrx, Ti1-x)O$_3$), and Bi-layered compounds such as SrBi$_2$Ta$_2$O$_9$. Herein, $0 \leq x \leq 1$, $0 \leq y \leq 1$. Alternatively, it is possible to use an organic material mixed with an inorganic material or a magnetic material as a dielectric material configuring a capacitor.

Additionally, it is possible to incorporate two or more semiconductor elements into a semiconductor device. Moreover, it is possible to incorporate LCR components, MEMS (Micro Electro Mechanical System) components, sensors, energy devices, and optical components as passive components other than semiconductor elements.

The manufacturing methods have been explained with respect to the first semiconductor device (FIG. 1), the tenth semiconductor device (FIG. 12), and the eleventh semiconductor device (FIG. 13); but it is possible to obtain the foregoing effects by reducing the thickness of the silicon support body 100 in advance with respect to the other semiconductor devices.

Additionally, the foregoing constitute elements of a semiconductor device can be selectively adopted or discarded, or they can be appropriately changed with other constituent elements unless these changes/selection/discarding will not be consistent to the intention of the present invention.

In a semiconductor device defined in the appended claims, it is preferable that the thickness of a semiconductor element be equal to 3 μm or more or 50 μm or less, while the support body be made of silicon; but this is not a restriction.

INDUSTRIAL APPLICABILITY

The present invention is preferably applied to semiconductor element incorporated substrates, which are produced according to the high-density packaging technology and incorporated into various types of electronic devices, and in particular, the present invention aims to reduce the warping and swelling which occur in manufacturing insulating resin substrates embedding semiconductor elements, thus reducing a yield rate of semiconductor devices and improving their reliability.

REFERENCE SIGNS LIST 100 silicon support body
101A, 101B, 101C, 101D semiconductor element
102A, 102B, 102C, 102D insulating layer
103A, 103B, 103C, 103D, 103E wiring layer
104A, 104B, 104C, 104D connector
105 adhesive layer
106A, 106B through-via
108A, 108B, 108C connector
109 external terminal
110 embedded insulator

The invention claimed is:

1. A semiconductor device comprising:
    a silicon support body which is reduced in thickness and is equipped with a plurality of through-vias;
    a semiconductor element mounted directly on a surface of the silicon support body;
    an insulating layer which is formed to embed the semiconductor element mounted on the silicon support body; and
    a plurality of wiring layers which are formed on opposite sides of the silicon support body in a thickness direction thereof, which are mutually connected via the through-vias, and which are connected to the semiconductor element,
    wherein a via hole of each of the through-vias is partially filled with a conductor to form a concave structure in which the opening of the concave is filled with an insulator, and
    wherein opening directions of concaves of the through-vias alternately change in vertical direction.

2. The semiconductor device according to claim 1, further comprising a plurality of connectors which connect the semiconductor element to the wiring layer formed on an opposite side of the silicon support body in view of the semiconductor element.

3. The semiconductor device according to claim 1, wherein the silicon support body is laminated with a plurality of insulating layers, and wherein the thickness of the insulating layer embedding the semiconductor element is thinner than the maximum thickness among the plurality of insulating layers.

4. A manufacturing method of a semiconductor device incorporating a semiconductor element in a multilayered wiring structure configured of a plurality of wiring layers and insulating layers, the manufacturing method of a semiconductor device comprising:
    forming a plurality of through-vias running through a silicon support body in a thickness direction thereof after reducing the thickness of the silicon support body to a desired thickness;
    mounting the semiconductor element directly on a surface of the silicon support body;
    forming an insulating layer on the silicon support body so as to embed the semiconductor element on the silicon support body therein; and
    forming a plurality of wiring layers on both surfaces of the silicon support body so as to connect the semiconductor element thereto,
    wherein a via hole of each of the through-vias is partially filled with a conductor to form a concave structure in which the opening of the concave is filled with an insulator, and
    wherein opening directions of concaves of the through-vias alternately change in vertical direction.

5. The semiconductor device according to claim 1, wherein local warping of the silicon support body mounting the semiconductor element thereon is reduced by controlling a position of the partially filled through-via and an opening direction of the through-vias in the silicon support body.

6. The manufacturing method of a semiconductor device according to claim 4, wherein the thickness of the semiconductor element is adjusted within a range between 3 μm and 30 μm depending on the target thickness.

7. The semiconductor device according to claim 1, wherein the thickness of the semiconductor element is adjusted within a range between 3 μm and 30 μm depending on the target thickness.

8. The manufacturing method of a semiconductor device according to claim 4, wherein local warping of the silicon support body mounting the semiconductor element thereon is reduced by controlling a position of the partially filled through via and an opening direction of the through-via in the silicon support body.

* * * * *